United States Patent
Watsuda et al.

(10) Patent No.: US 11,145,251 B2
(45) Date of Patent: Oct. 12, 2021

(54) DISPLAY DEVICE

(71) Applicant: InnoLux Corporation, Miao-Li County (TW)

(72) Inventors: Hirofumi Watsuda, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 253 days.

(21) Appl. No.: 16/407,420

(22) Filed: May 9, 2019

(65) Prior Publication Data
US 2020/0126480 A1   Apr. 23, 2020

Related U.S. Application Data

(60) Provisional application No. 62/749,135, filed on Oct. 23, 2018.

(51) Int. Cl.
*G09G 3/3233* (2016.01)
*H01L 51/52* (2006.01)

(52) U.S. Cl.
CPC ....... *G09G 3/3233* (2013.01); *H01L 51/5206* (2013.01); *H01L 51/5221* (2013.01)

(58) Field of Classification Search
CPC .............. G09G 3/3233; H01L 51/5206; H01L 51/5221
See application file for complete search history.

(56) References Cited

U.S. PATENT DOCUMENTS

| | | | | |
|---|---|---|---|---|
| 6,060,727 A * | 5/2000 | Shakuda | ................. | H01L 27/15 257/89 |
| 7,138,967 B2 * | 11/2006 | Kimura | ................. | G09G 5/399 345/76 |
| 9,337,242 B2 * | 5/2016 | Furuie | ................. | H01L 27/3213 |
| 10,333,035 B2 * | 6/2019 | Cha | ........................ | H01L 33/504 |
| 10,763,317 B2 * | 9/2020 | Lee | ..................... | H01L 27/3258 |
| 10,917,549 B2 * | 2/2021 | Jia | ........................ | H04M 1/0264 |
| 10,923,635 B2 * | 2/2021 | Vampola | ............. | H01L 25/0753 |
| 2002/0000967 A1 * | 1/2002 | Huston | ................ | G09G 3/3406 345/88 |
| 2002/0000994 A1 * | 1/2002 | Bergstrom | ........... | G09G 3/2092 345/605 |
| 2002/0047822 A1 * | 4/2002 | Senda | ..................... | G09G 3/32 345/90 |
| 2002/0101396 A1 * | 8/2002 | Huston | ................ | G09G 3/3648 345/87 |
| 2003/0063054 A1 * | 4/2003 | Inukai | .................. | G09G 3/3233 345/83 |
| 2004/0113872 A1 * | 6/2004 | Nanno | ................. | G09G 3/3266 345/76 |
| 2005/0156635 A1 * | 7/2005 | Yoneyama | ............... | G09G 3/32 327/108 |

(Continued)

*Primary Examiner* — Ricardo Osorio
(74) *Attorney, Agent, or Firm* — McClure, Qualey & Rodack, LLP

(57) ABSTRACT

A display device is provided that includes a plurality of sub-pixels. Each sub-pixel includes a light-emitting unit having an illumination area, wherein the illumination area is divided into a plurality of illumination regions, and each illumination region is configured to be illuminated independently. The light-emitting unit emits a light, and a gray level of the light is determined according to the total area of the illumination regions being illuminated.

17 Claims, 11 Drawing Sheets

(56) References Cited

U.S. PATENT DOCUMENTS

| | | | | |
|---|---|---|---|---|
| 2007/0063959 A1* | 3/2007 | Iwabuchi | G09G 3/3688 | 345/100 |
| 2008/0197784 A1* | 8/2008 | Benzarti | G09G 3/3233 | 315/169.3 |
| 2011/0001693 A1* | 1/2011 | Kim | G02F 1/133615 | 345/102 |
| 2013/0314308 A1* | 11/2013 | Hsu | G09G 3/3233 | 345/82 |
| 2014/0132649 A1* | 5/2014 | Shi | G09G 5/10 | 345/694 |
| 2014/0152712 A1* | 6/2014 | Shishido | G09G 3/3233 | 345/690 |
| 2014/0300711 A1* | 10/2014 | Kroon | H04N 13/305 | 348/51 |
| 2015/0345724 A1* | 12/2015 | Leadford | F21V 23/003 | 362/244 |
| 2017/0062515 A1* | 3/2017 | Kim | H01L 33/06 | |
| 2017/0301283 A1* | 10/2017 | Liu | G09G 3/3233 | |
| 2017/0365224 A1* | 12/2017 | Okamoto | G09G 3/3426 | |
| 2018/0053460 A1* | 2/2018 | Watsuda | G09G 3/2074 | |
| 2018/0101712 A1* | 4/2018 | Tsai | H01L 27/323 | |
| 2018/0158847 A1* | 6/2018 | Chang | H01L 27/1259 | |
| 2018/0198020 A1* | 7/2018 | Lai | H01L 27/1259 | |
| 2019/0171403 A1* | 6/2019 | Hall | H05K 5/0017 | |

* cited by examiner

DISPLAY DEVICE

This application claims the benefit of U.S. Provisional Application No. 62/749,135, filed Oct. 23, 2018, the entirety of which is incorporated by reference herein.

BACKGROUND OF THE DISCLOSURE

Field of the Disclosure

The disclosure relates to a display device, and more particularly to an LED display device.

Description of the Related Art

In conventional display devices, such as an LED or backlight display device, the gray-scale control method is one of the key technologies for enhancing the quality of the image shown by the display devices.

One conventional gray-scale control method is the current control drive method. Because the light-emission intensity of an LED device depends on the driving current provided to the LED device, the luminance of the LED device can be controlled by adjusting the driving current. However, this method contains several drawbacks. For example, the output power of the LED device may become unstable when the driving current is too low, and the luminous efficiency of the LED device may be low as well. Furthermore, the color tone of the light is also unstable in the low-current range.

Another conventional method for controlling luminance of an LED device is the pulse width modulation (PWM) method. The luminance of an LED device can be controlled by changing the duty ratio of the LED device in a specific period, and the driving current is fixed. However, this method requires fine pulse-width control and high-frequency operation, which are hard to control. Furthermore, flickering and noise problems are also possible risks that may occur when using the PWM method.

BRIEF SUMMARY OF THE DISCLOSURE

A display device is provided and includes a plurality of sub-pixels in some embodiments of the present disclosure. Each of the plurality of the sub-pixels includes a light-emitting unit having an illumination area, wherein the illumination area is divided into a plurality of illumination regions, and each of the plurality of illumination regions is configured to be illuminated independently. The light-emitting unit emits a light, and a gray level of the light is expressed according to the total area of the plurality of the illumination regions being illuminated.

A display device is provided and includes a substrate and a plurality of light-emitting units disposed on the substrate and divided into a plurality of illumination regions, each illumination region being configured to be illuminated independently. One of the plurality of the light-emitting unit includes a first-type semiconductor layer disposed on the substrate, a light-emitting layer disposed on the first-type semiconductor layer, and a second-type semiconductor layer disposed on the first-type semiconductor layer.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
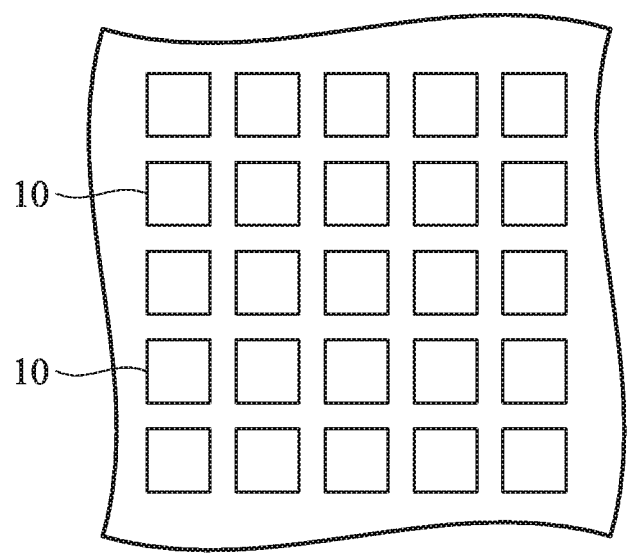
FIG. 1 shows a portion of a display device having a plurality of sub-pixels.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used for ease of the present disclosure of one features relationship to another feature. The spatially relative terms are intended to cover different orientations of the device including the features.

Figure 2:
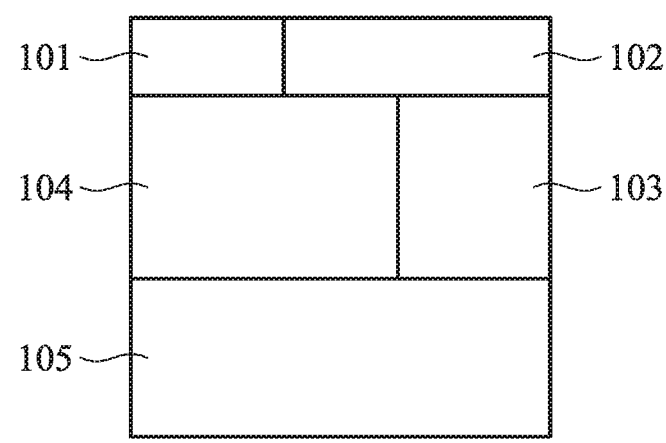
FIG. 2 shows an illumination area of a sub-pixel.

FIG. 1 shows a portion of a display device 1 having a plurality of sub-pixels 10. In some embodiments, the sub-pixels 10 may be arranged in a row and column manner, but the present disclosure is not limited thereto. Each sub-pixel 10 includes a light-emitting unit and other elements such as circuits (not shown), and the light-emitting unit has an illumination area. For example, FIG. 2 shows the illumination area 100 of a sub-pixel 10. In FIG. 2, the illumination area 100 is divided into a plurality of illumination regions 101, 102, 103, 104 and 105, each illumination region 101, 102, 103, 104 and 105 being configured to be illuminated independently. In one embodiment, the number of the plurality of illumination regions may be greater than or equal to 5, but not limited thereto. In some embodiments, the illumination area 100 is divided into at least five illumination regions, such as the illumination regions 101, 102, 103, 104 and 105 to allow the illumination area 100 of the sub-pixel 10 having gray-scale control ability. In some embodiments, the display device 1 may be LED display devices such as an organic LED (OLED) display device, a quantum LED (QLED) display device, a micro LED display device or a mini LED display device, etc.

Figure 3A:
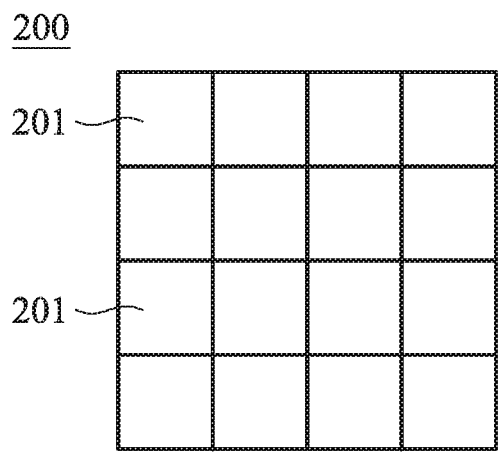
FIG. 3A is a schematic view of an illumination area.

FIG. 3A is a schematic view of an illumination area 200. In FIG. 3A, the illumination area 200 has a plurality of illumination regions 201 have substantially identical shapes and/or area, but not limited thereto. For example, the illumination regions 201 may be substantially identical rectangles or squares. In some embodiments where the illumination area 200 is divided into 16 pieces, the illumination area 200 has seventeen gray scales (from $0^{th}$ to $16^{th}$). For example, the gray scales may be controlled by the number of illumination regions 201 which are activated.

Figure 3B:
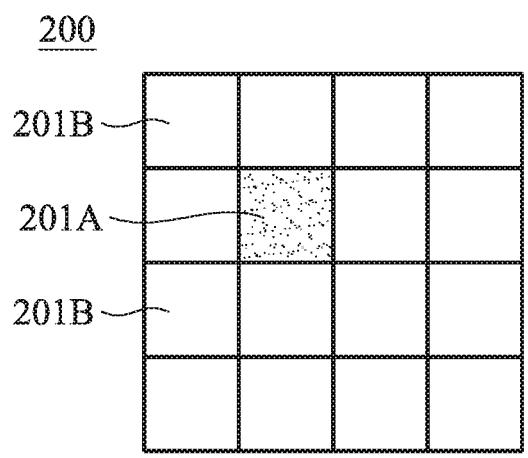
FIGS. 3B to 3E show several examples of how the illumination area expresses the gray scales.
Figure 3C:
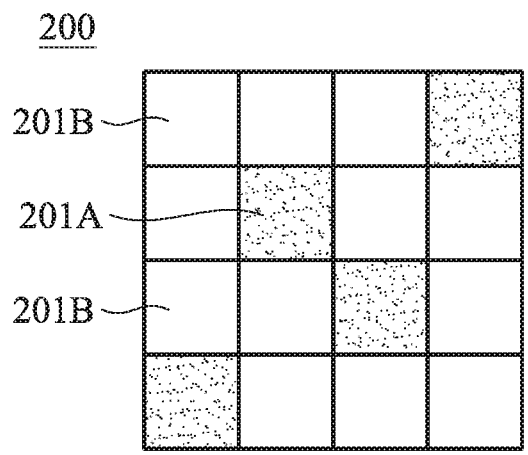
Figure 3D:
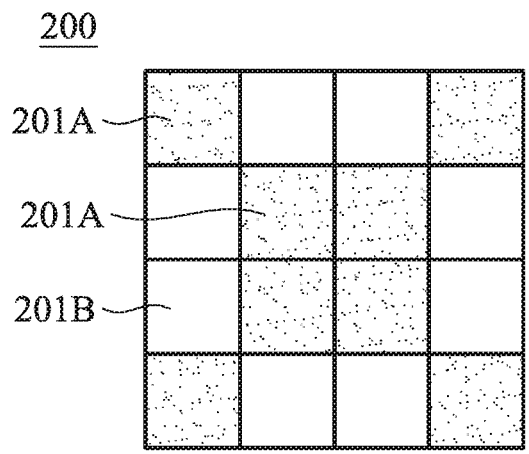
Figure 3E:
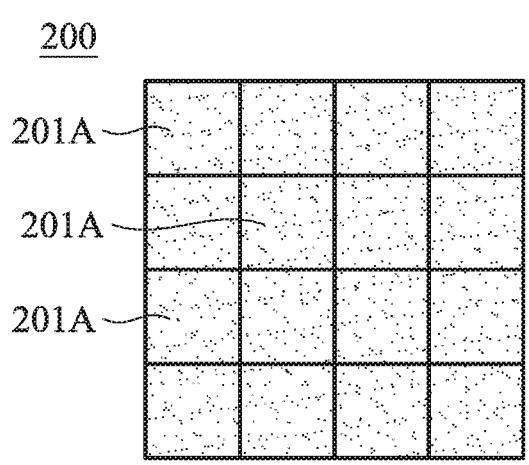

FIGS. 3B to 3E and Table 1 show several examples of how the illumination area 200 expresses the gray scales. Here, numerical number 201A indicates an activated illumination region 201 (ON), and numerical number 201B indicates a deactivated illumination region 201 (OFF). For example, if no illumination region 201 is activated (ON), the illumination area 200 may be the "$0^{th}$" gray scale. In FIG. 3B, only one illumination region 201A is activated (ON), and the rest of fifteen illumination regions 201B are not (OFF), which is the "$1^{st}$" gray scale. In FIG. 3C, four illumination regions 201A are activated, and the rest of twelve illumination regions 201B are not, which is the "$4^{th}$" gray scale. Similarly, eight and sixteen illumination regions 201A are activated in FIGS. 3D and 3E, respectively, which are the "$8^{th}$" and the "$16^{th}$" gray scales. As a result, the light-emitting unit emits a light, and a gray level of the light is determined according to the total area of the illumination regions 201 being illuminated (activated).

TABLE 1

Examples of gray-scale expression of the illumination area 200

| gray scales | Total activated illumination regions |
|---|---|
| $0^{th}$ | 0/16 |
| $1^{st}$ | 1/16 |
| $4^{th}$ | 4/16 |
| $8^{th}$ | 8/16 |
| $16^{th}$ | 16/16 |

The positions of the illumination regions 201 which are activated in each gray-scale may be adjusted according to design requirements, and is not limited to the embodiments shown. Furthermore, each illumination region 201 is driven with the same current density, so its output power and color tone will be stable.

Figure 4A:
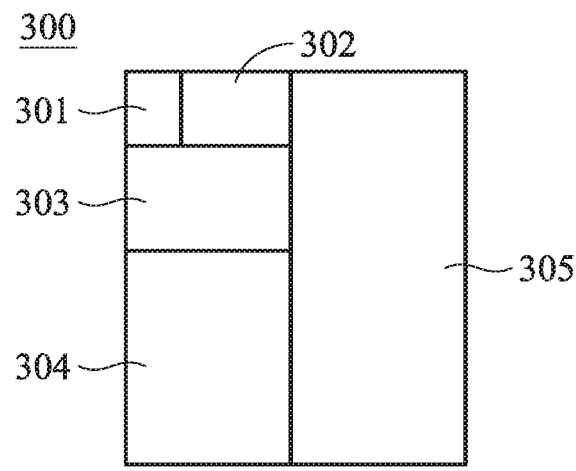
FIG. 4A is a schematic view of an illumination area.
Figure 4B:
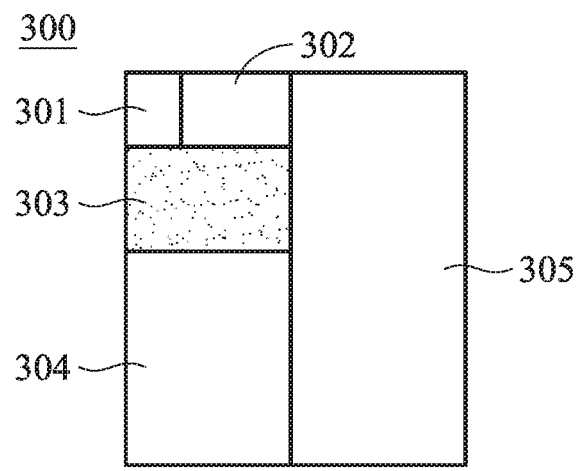
FIGS. 4B to 4E show several examples of how the illumination area expresses the gray scales.

FIG. 4A is a schematic view of an illumination area 300. In FIG. 4A, the illumination area 300 has a plurality of illumination regions 301, 302, 303, 304 and 305 have different areas. In some embodiments, the area of the illumination regions 301, 302, 303, 304 and 305 may be determined according to a binary weighting method. That is, the area ratio of the illumination regions 301, 302, 303, 304 and 305 may be $1:2:2^2:2^3:2^4$ (1:2:4:8:16). In this configuration, the illumination area 200 has 32 ($2^5$) gray scales and several examples of gray-scale expression of the illumination area 300 are shown in Table 2. However, the present disclosure is not limited thereto. For example, in some embodiments, the area of the illumination regions may also be determined by quaternary (i.e. the area ratio of the illumination regions is $1:4:4^2:4^3:4^4$) or octal (i.e. the area ratio of the illumination regions is $1:6:6^2:6^3:6^4$) weighting method, depending on design requirements.

TABLE 2

Examples of gray-scale expression of the illumination area 300

| | | Illumination region | | | | |
|---|---|---|---|---|---|---|
| | | 301 | 302 | 303 | 304 | 305 |
| gray scales | $0^{th}$ | OFF | OFF | OFF | OFF | OFF |
| | $4^{th}$ | OFF | OFF | ON | OFF | OFF |
| | $10^{th}$ | OFF | ON | OFF | ON | OFF |
| | $21^{st}$ | ON | OFF | ON | OFF | ON |
| | $31^{st}$ | ON | ON | ON | ON | ON |

Figure 4C:
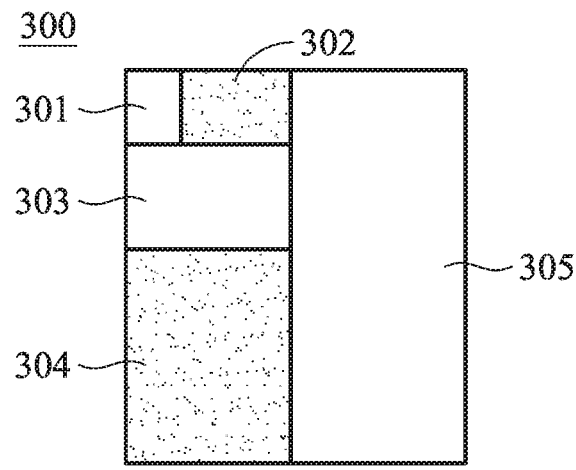
Figure 4D:
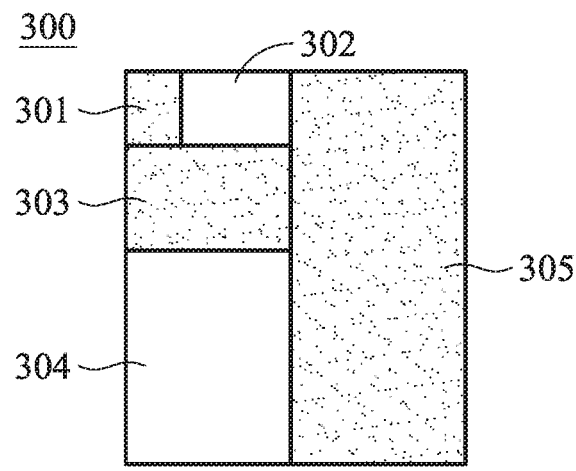
Figure 4E:
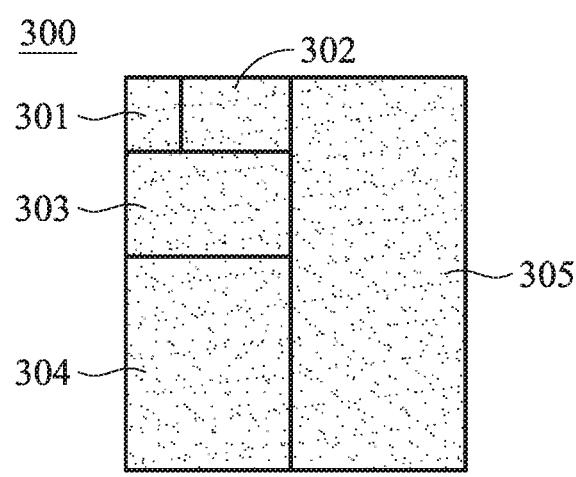

FIGS. 4B to 4E and Table 2 show several examples of how the illumination area 300 determines the gray scales. For example, in FIG. 4B, only the illumination region 303 is activated (ON), and the rest of the illumination regions 301, 302, 304 and 305 are not (OFF), which is the "$4^{th}$" gray scale. In FIG. 4C, the illumination regions 302 and 304 are activated, and the illumination regions 301, 303 and 305 are not, which is the "$10^{th}$" gray scale. Similarly, FIGS. 4D and 4E illustrate the "$21^{st}$" and the "$31^{st}$" gray scales, respectively. Furthermore, each of the illumination regions 301, 302, 303, 304 and 305 is driven with substantially identical current density and light-emitting period, so their output power and color tone will be stable even when the driving current is low.

Figure 5:
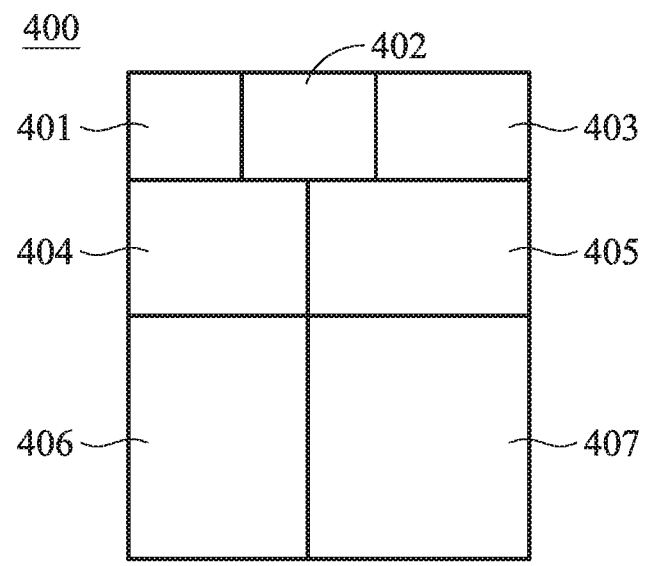
FIG. 5 is a schematic view of an illumination area.

FIG. 5 is a schematic view of an illumination area 400. In FIG. 5, the illumination area 400 is divided into illumination regions 401, 402, 403, 404, 405, 406 and 407 having different shapes and areas to reach a more flexible gray-scale control, such as non-linear gray-scale control. Several examples of gray-scale expression of the illumination area 400 are shown in Table 3. In some embodiments, the ratio of the areas of the illumination regions 401, 402, 403, 404, 405, 406 and 407 may be 1:1.2:1.5:1.9:2.8:4.0:5.8 to achieve a non-linear gray-scale control, but the present disclosure is not limited thereto.

TABLE 3

Examples of gray-scale expression of the illumination area 400

| gray scales | total area | Illumination region | | | | | | |
|---|---|---|---|---|---|---|---|---|
| | | 401 | 402 | 403 | 404 | 405 | 406 | 407 |
| 0 | 0 | OFF | OFF | OFF | OFF | OFF | OFF | OFF |
| 1 | 1 | ON | OFF | OFF | OFF | OFF | OFF | OFF |
| 2 | 1.2 | OFF | ON | OFF | OFF | OFF | OFF | OFF |
| 3 | 1.5 | OFF | OFF | ON | OFF | OFF | OFF | OFF |
| 4 | 1.9 | OFF | OFF | OFF | ON | OFF | OFF | OFF |
| 5 | 2.2 | ON | ON | OFF | OFF | OFF | OFF | OFF |
| 6 | 2.5 | ON | OFF | ON | OFF | OFF | OFF | OFF |

Figure 6A:
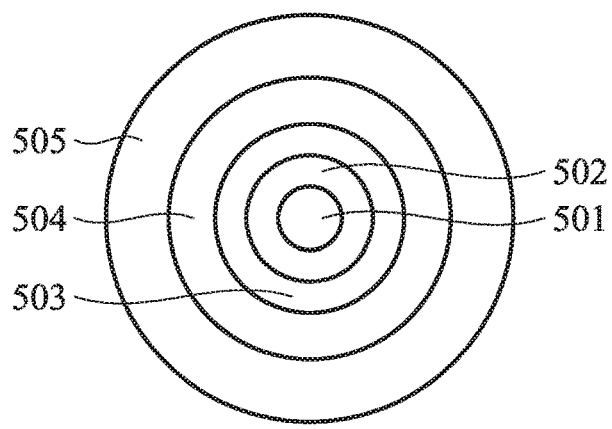
FIGS. 6A to 6C illustrate illumination areas according to some embodiments of the present disclosure.
Figure 6B:
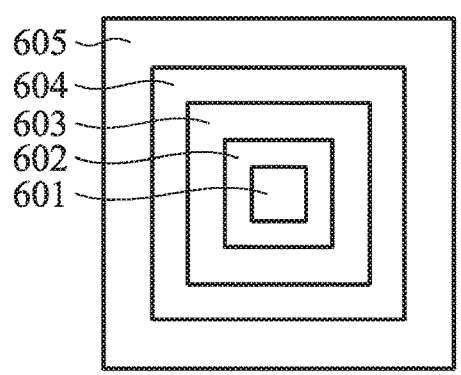
Figure 6C:
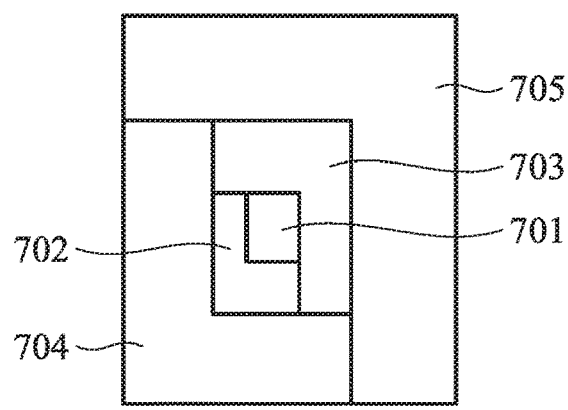

FIGS. 6A to 6C illustrate illumination areas according to some embodiments of the present disclosure. In some embodiments, an illumination area 500 is shown in FIG. 6A and includes illumination regions 501, 502, 503, 504 and 505 arranged in a concentric manner, such as being concentric circles. In other words, except for the outermost illumination region 505, other illumination regions (501 to 504) are surrounded by other illumination regions. In other embodiments, an illumination area 600 is shown in FIG. 6B and includes illumination regions 601, 602, 603, 604 and 605 arranged as concentric squares, which is also a concentric manner. In some embodiments, the illumination area may include combination of rectangle and L-shape illumination regions. For example, an illumination area 700 includes a rectangular illumination region 701 and four L-shaped illumination regions 702, 703, 704 and 705 is shown in FIG. 6C. As a result, the illumination regions of the illumination areas illustrated in the present disclosure may be arranged in various suitable manners, depending on design requirements.

Figure 7A:
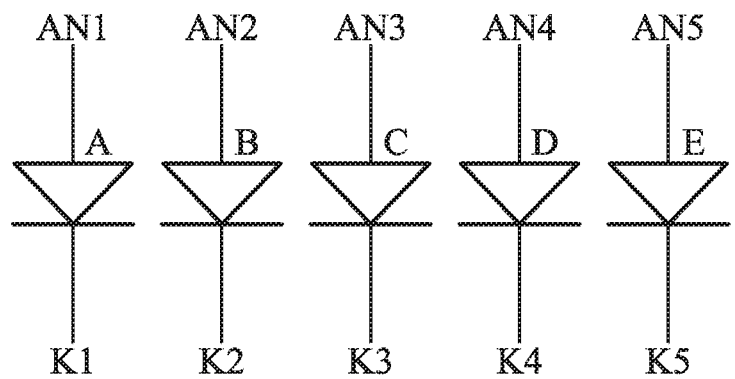
FIGS. 7A to 7C show equivalent circuit diagrams of different electrode arrangements in the display devices provided in some embodiments of the present disclosure.
Figure 7B:
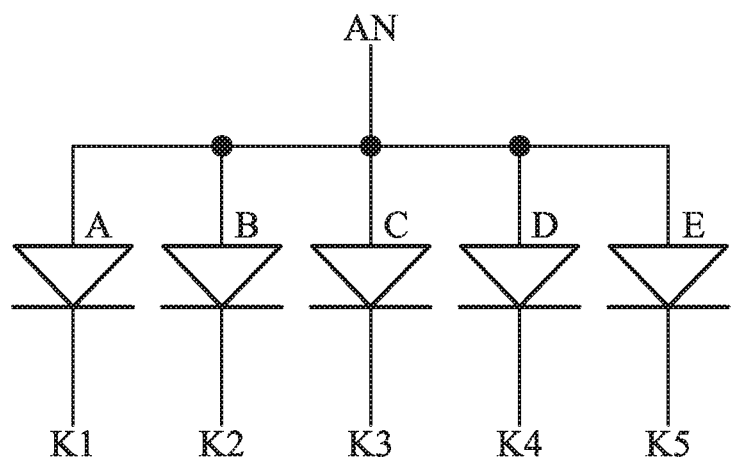
Figure 7C:
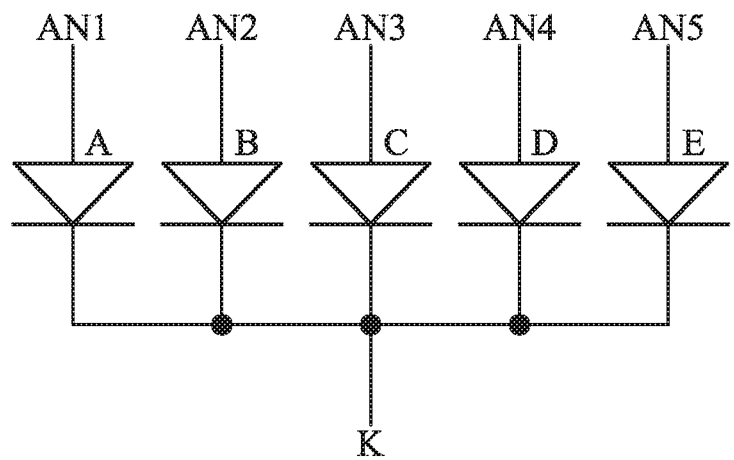

FIGS. 7A to 7C show equivalent circuit diagrams of different electrode arrangements in the display devices provided in some embodiments of the present disclosure. In FIG. 7A, a display device 2 includes a plurality of illumination regions A, B, C, D and E having different anode electrodes AN1, AN2, AN3, AN4 and AN5 and different cathode electrodes K1, K2, K3, K4 and K5, respectively. As a result, each of the illumination regions A, B, C, D and E may be controlled independently.

However, the present disclosure is not limited thereto. For example, as shown in FIG. 7B, a display device 3 includes a plurality of illumination regions A, B, C, D and E having different cathode electrodes K1, K2, K3, K4 and K5, respectively, but share a common anode electrode AN. In some embodiments, the display device may share a common cathode electrode K. For example, as shown in FIG. 7C, a display device 4 includes a plurality of illumination regions A, B, C, D and E having different anode electrodes AN1, AN2, AN3, AN4 and AN5, respectively, but share a common cathode electrode K. As a result, the number of electrodes in a display device may be reduced to simplify the manufacturing process and to reduce the cost. It should be noted that the illumination regions A, B, C, D and E do not share a substantially identical anode electrode and a substantially identical cathode electrode at the same time to allow the illumination regions A, B, C, D and E being controlled separately.

Figure 8A:
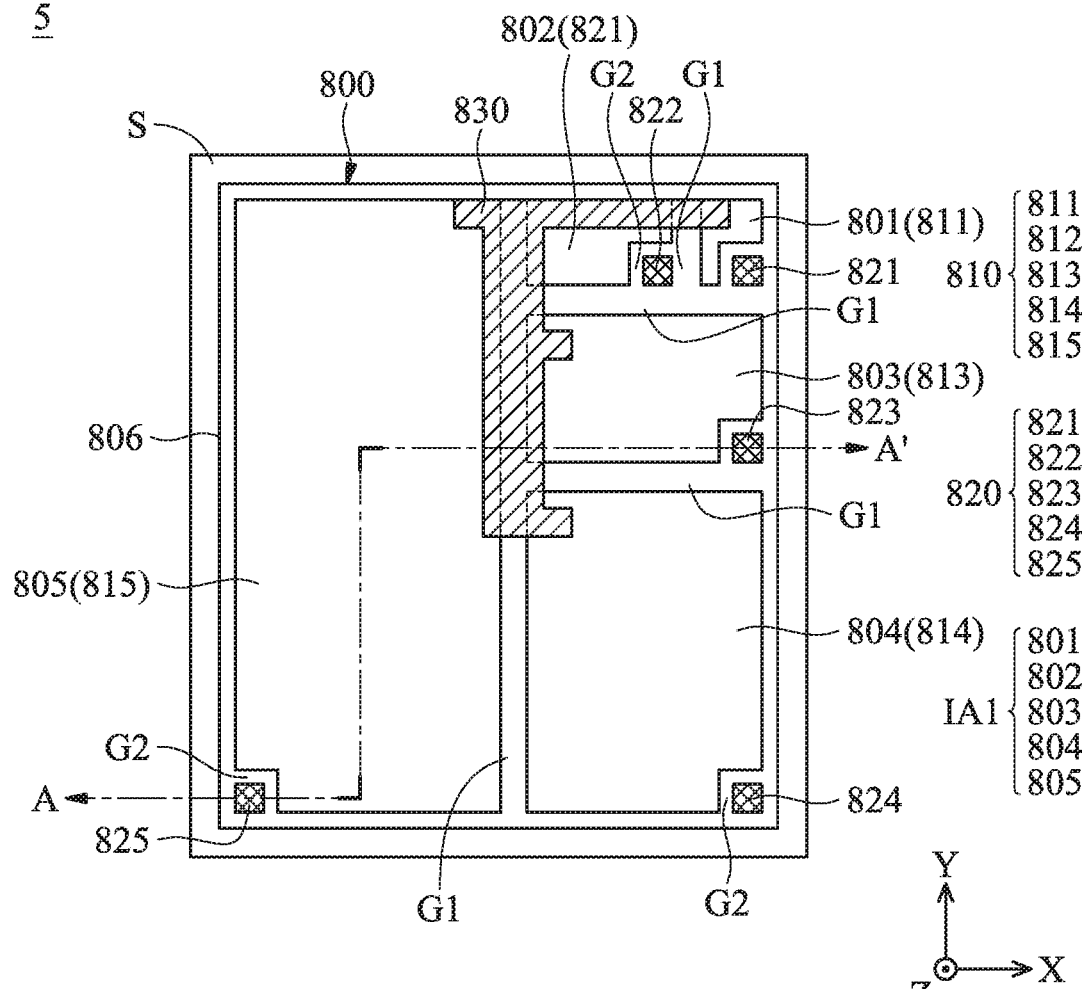
FIGS. 8A and 8B are a top view and a cross-sectional view of a display device, respectively.
Figure 8B:
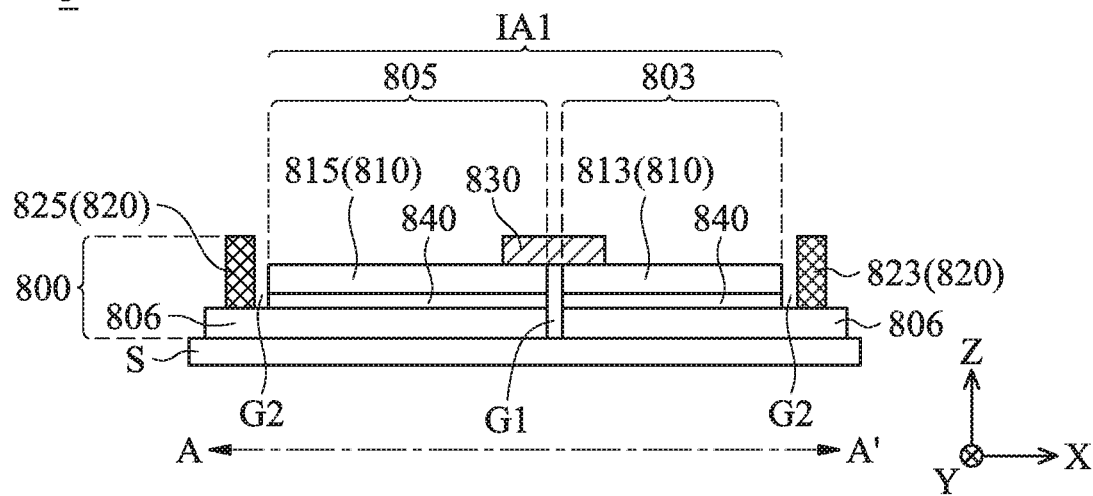

FIG. 8A is a top view of a display device 5, and FIG. 8B is a cross-sectional view of the display device 5 illustrated along the line A-A' in FIG. 8A. The display device mainly includes a substrate S and a light-emitting unit 800, and the light-emitting unit 800 includes a first-type semiconductor layer 806 disposed on the substrate S, a light-emitting layer 840 disposed on the first-type semiconductor layer 806 and a second-type semiconductor layer 810 disposed on the light-emitting layer 840. In some embodiments, the first-type semiconductor layer 806 and the second-type semiconductor layer 810 have different doping types. For example, when the first-type semiconductor layer 806 includes n-type semiconductor, the second-type semiconductor layer 810 may include p-type semiconductor to allow p-n junction forming between the first-type semiconductor layer 806 and the second-type semiconductor layer 810 for forming an LED.

The light-emitting unit 800 includes an illumination area IA1 having a plurality of illumination regions, such as the illumination regions 801, 802, 803, 804 and 805 in FIG. 8A or the illumination regions 803 and 805 in FIG. 8B. In the present disclosure, the illumination regions of the display device 5 are defined by the light-emitting layer 840. The second-type semiconductor layer 810 is divided (separated) to portions 811 (first portion), 812 (second portion), 813 (third portion), 814 (fourth portion) and 815 (fifth portion) in the illumination regions 801, 802, 803, 804 and 805, respectively. Cathode electrodes 821, 822, 823, 824 and 825 are disposed in the illumination regions 801, 802, 803, 804 and 805, respectively, and are disposed on the first-type semiconductor layer 806.

In this embodiment, a common anode electrode 830 is disposed on the portions 811, 812, 813, 814 and 815 for electrically connecting these portions (a common anode electrode 830 is disposed on the second-type semiconductor layer 810), and a plurality of cathode electrodes 820 are disposed on the first-type semiconductor layer (806), as the equivalent circuit diagram shown in FIG. 7B. It should be noted that the portions of the illumination regions 801, 802, 803, 804 and 805 between the common anode electrode 830 and the substrate S are illustrated in dashed lines in FIG. 8A. As a result, the number of electrodes (include the (common) anode electrode and the (common) cathode electrode) in a display device may be reduced to simplify the process and to reduce the cost. It should be noted that the cathode electrode 820 (includes the cathode electrodes 821, 822, 823, 824 and 825) and the anode electrode 830 do not overlap with each other when viewed in a direction that is perpendicular to the illumination area (or the substrate S) (i.e. the Z direction), and a gap G1 is under the anode electrode 830 and between the portions 811, 812, 813, 814 and 815 to avoid short circuit. There is a gap G2 between the cathode electrode 820 and the second-type semiconductor layer 810.

Figure 9A:
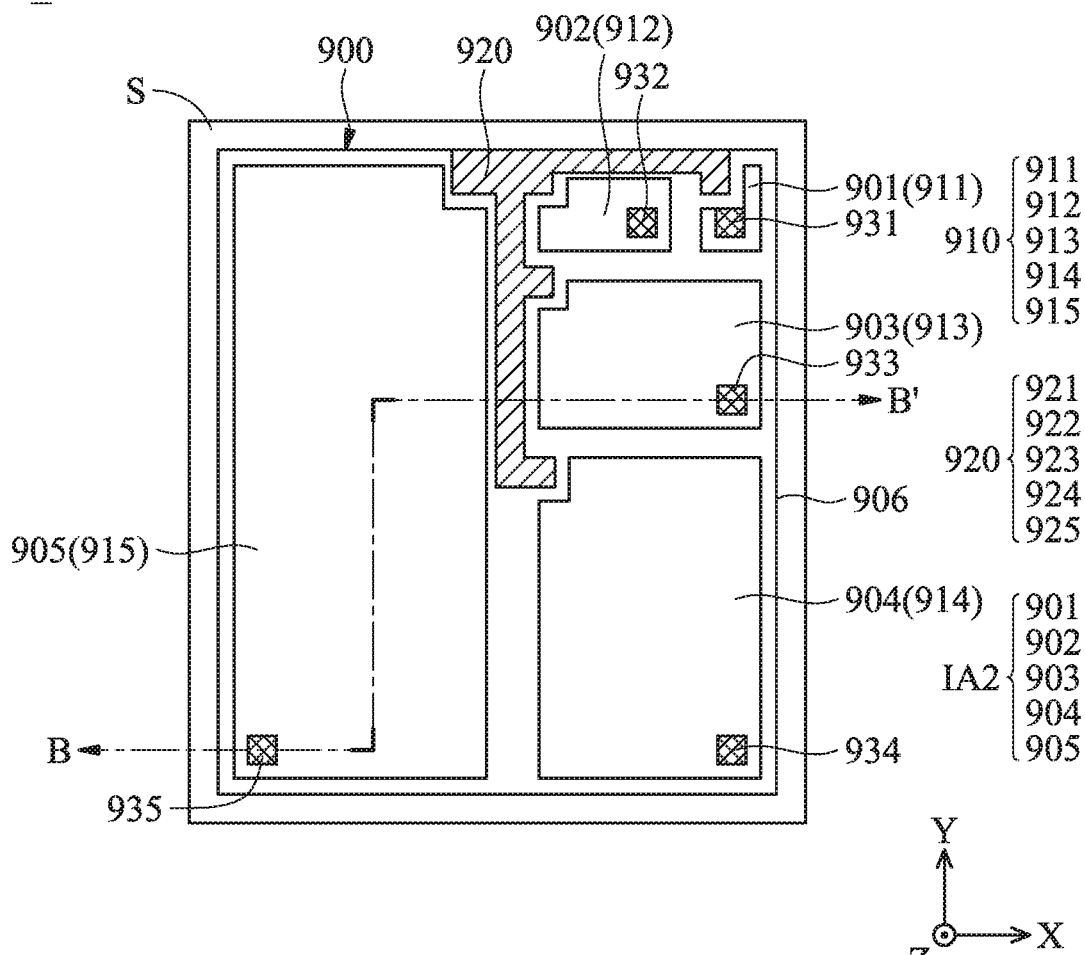
FIGS. 9A and 9B are a top view and a cross-sectional view of a display device, respectively.
Figure 9B:
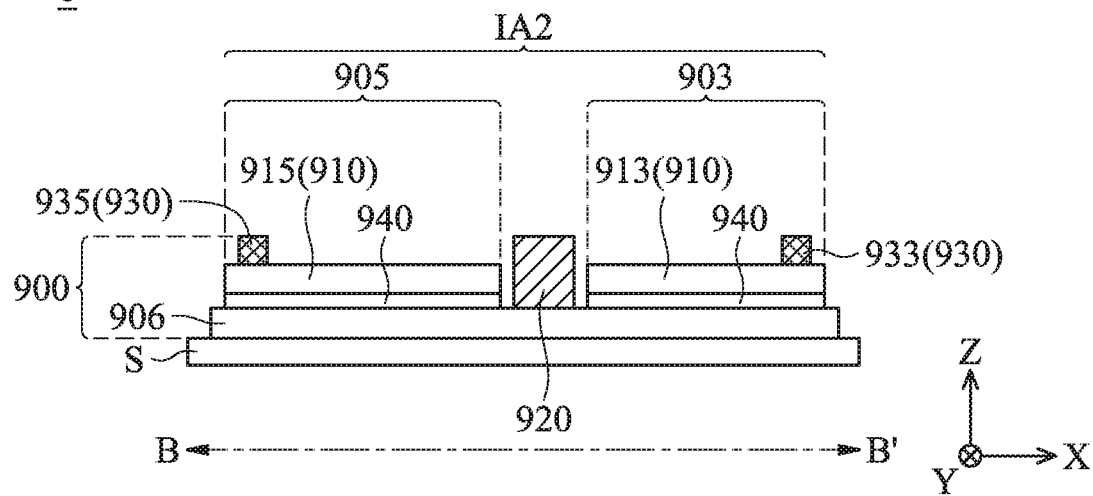

In the aforementioned embodiments, the electrode shared by different illumination regions is disposed on the second-type semiconductor layer 810, but the present disclosure is not limited thereto. For example, FIG. 9A is a top view of a display device 6, and FIG. 9B is a cross-sectional view of the display device 6 illustrated along the line B-B' in FIG. 9A. The display device 6 mainly includes a substrate S and a light-emitting unit 900, and the light-emitting unit 900 includes a first-type semiconductor layer 906 disposed on the substrate S, a light-emitting layer 940 disposed on the first-type semiconductor layer 906 and a second-type semiconductor layer 910 disposed on the light-emitting layer 940.

The light-emitting unit 900 includes an illumination area IA2 having a plurality of illumination regions, such as the illumination regions 901, 902, 903, 904 and 905 shown in FIG. 9A or the illumination regions 903 and 905 shown in FIG. 9B. In the present disclosure, the illumination regions of the display device 6 are defined by the light-emitting layer 940. The second-type semiconductor layer 910 is separated to portions 911, 912, 913, 914 and 915 in the illumination regions 901, 902, 903, 904 and 905, respectively. Anode electrodes 931, 932, 933, 934 and 935 are disposed in the illumination regions 901, 902, 903, 904 and 905, respectively, and are disposed on the second-type semiconductor layer 910.

In this embodiment, a common cathode electrode 920 is disposed on first-type semiconductor layer 906 for electrically connecting illumination regions 901, 902, 903, 904 and 905, as the equivalent circuit diagram shown in FIG. 7C. And the plurality of illumination regions share a common cathode electrode. As a result, the number of electrodes in a display device may be reduced to simplify the process and to reduce the cost. It should be noted that in some embodiments, in different gray levels of the light emitted by the light-emitting unit 900, a driving current for controlling the light-emitting unit 900 may have a substantially identical current density and/or substantially identical light-emitting period. It should be noted that the cathode electrode 920 and the anode electrode 930 (includes the anode electrodes 931, 932, 933, 934 and 935) do not overlap with each other when viewed in a direction that is perpendicular to the illumination area (or the substrate S) (i.e. the Z direction) to avoid short circuit.

In the aforementioned embodiments, a person having skill in the art will realize that the position of the n-type semiconductor and the p-type semiconductor may be exchanged, and thus the positions of the anode and cathode electrodes may be exchanged accordingly, depending on design requirements.

Figure 10A:
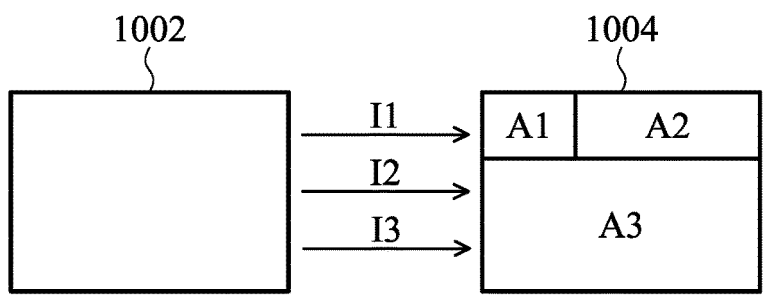
FIG. 10A is a schematic view of a display device.
Figure 10B:
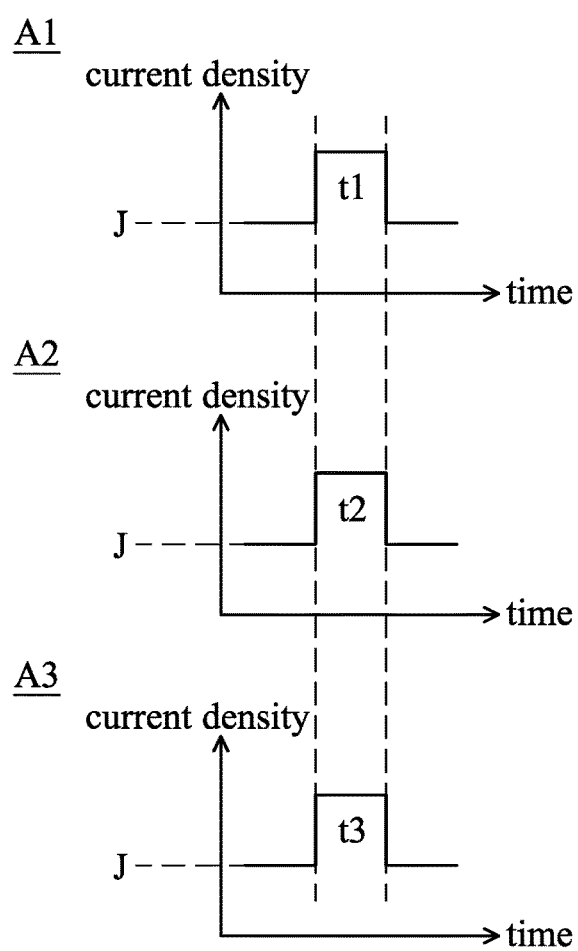
FIG. 10B shows the relationship between the current provided by the controller to the light-emitting unit and the time.

FIG. 10A is a schematic view of a display device 7. The display device 7 includes a controller 1002 and a light-emitting unit 1004, and the controller 1002 electrically connected to the light-emitting unit 1004. The controller 1002 provides a driving current to the light-emitting unit 1004 for controlling the light-emitting unit 1004. FIG. 10B shows the relationship between the current provided by the controller 1002 to the light-emitting unit 1004 and the time. In some embodiments, the driving current has a substantially identical light-emitting period in different gray levels of the light. For example, as shown in FIGS. 10A and 10B, the light-emitting unit 1004 includes an illumination area A1, an illumination area A2, and an illumination area A3 in some embodiments. In some embodiments, the controller 1002 provides current I1, current I2, current I3 to the illumination area A1, the illumination area A2, the illumination area A3, respectively. The current I1 has a light emitting period t1, the current I2 has a light emitting period t2, and the current I3 has a light emitting period t3. In some embodiments, the light emitting period t1, the light emitting period t2, and the light emitting period t3 are substantially identical. In some embodiments, the driving current has a substantially identical current density in different gray levels of the light. For example, the current I1, the current I2, the current I3 has a substantially identical current density J. The current I1 equals to the current density J times the illumination area A1, i.e. I1=J*A1. Similarly, the current I2 equals to the current density J times the illumination area A2(I2=J*A2), and the current I3 equals to the current density J times the illumination area A3(I3=J*A3). As a result, the gray level of the light can be achieved with a stable driving current provided to the light-emitting unit 1004. It should be noted that the controller 1002 is also suitable for other aforementioned display devices, such as the display devices 5 or 6. In such situation, the controller 1002 may be electrically connected to the light-emitting unit 800 or 900 to perform a similar function described above."

In summary, a display device having an illumination area divided into a plurality of illumination regions is provided in the present disclosure. By separating the illumination area into a plurality of illumination regions, gray-scale control can be achieved with constant current density and operation current density, which can enhance the stability of the display device. Furthermore, a structure of a light-emitting unit having a common electrode is also provided to reduce the number of electrodes.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A display device comprising:
a substrate; and
a plurality of sub-pixels, wherein each of the plurality of sub-pixels comprises a light-emitting unit having an illumination area, wherein the illumination area is divided into a plurality of illumination regions, each of the plurality of illumination regions being configured to be illuminated independently;
wherein the light-emitting unit emits a light, and a gray level of the light is expressed according to a total area of the plurality of illumination regions being illuminated
wherein one of the plurality of light emitting units comprises:
a first-type semiconductor layer disposed on the substrate;
a light-emitting layer disposed on the first-type semiconductor layer;
a second-type semiconductor layer disposed on the first-type semiconductor layer;
a cathode electrode disposed on the first-type semiconductor layer; and
an anode electrode disposed on the second-type semiconductor layer, wherein the anode electrode and the cathode electrode do not overlap with each other when viewed in a direction that is perpendicular to the substrate, and an area of the anode electrode is different from the cathode electrode.

2. The display device as claimed in claim 1, wherein each of the plurality of illumination regions has an identical area.

3. The display device as claimed in claim 1, wherein each of the plurality of illumination regions has a different area.

4. The display device as claimed in claim 3, wherein the areas of the plurality of illumination regions are determined using a binary, quaternary, or octal weighting method.

5. The display device as claimed in claim 1, wherein each of the plurality of illumination regions is in a shape of a rectangle.

6. The display device as claimed in claim 1, wherein each of the plurality of illumination regions is L-shaped.

7. The display device as claimed in claim 1, wherein the plurality of illumination regions are arranged in a concentric manner.

8. The display device as claimed in claim 1, wherein the plurality of illumination regions share the cathode electrode.

9. The display device as claimed in claim 1, wherein the plurality of illumination regions share the anode electrode.

10. The display device as claimed in claim 1, wherein the second-type semiconductor layer is separated to a first portion and a second portion, and a gap is between the first portion and the second portion.

11. The display device as claimed in claim 1, further comprising a controller providing a driving current for controlling the light-emitting unit, wherein the driving current has a substantially identical light-emitting period in different gray levels of the light.

12. The display device as claimed in claim 1, further comprising a controller providing a driving current for controlling the light-emitting unit, wherein the driving current has a substantially identical current density in different gray levels of the light.

13. The display device as claimed in claim 1, wherein one of the plurality of illumination regions is surrounded by another one of the plurality of illumination regions.

14. A display device, comprising:
   a substrate; and
   a plurality of light-emitting units disposed on the substrate and divided into a plurality of illumination regions, each of the plurality of illumination region being configured to be illuminated independently, and one of the plurality of light-emitting unit comprises:
   a first-type semiconductor layer disposed on the substrate;
   a light-emitting layer disposed on the first-type semiconductor layer;
   a second-type semiconductor layer disposed on the first-type semiconductor layer;
   a cathode electrode disposed on the first-type semiconductor layer; and
   an anode electrode disposed on the second-type semiconductor layer, wherein the anode electrode and the cathode electrode do not overlap with each other when viewed in a direction that is perpendicular to the substrate, and an area of the anode electrode is different from the cathode electrode.

15. The display device as claimed in claim 14, wherein a gap is between the cathode electrode and the second-type semiconductor layer.

16. The display device as claimed in claim 14, wherein the number of the plurality of illumination regions is greater than or equal to 5.

17. The display device as claimed in claim 14, wherein the second-type semiconductor layer is divided into a plurality of portions.

* * * * *